United States Patent
Choi et al.

(10) Patent No.: US 12,424,585 B2
(45) Date of Patent: Sep. 23, 2025

(54) APPARATUS FOR BONDING CHIP BAND AND METHOD FOR BONDING CHIP USING THE SAME

(71) Applicant: Samsung Electronics Co., Ltd., Suwon-si (KR)

(72) Inventors: Euisun Choi, Hwaseong-si (KR); Huijae Kim, Jeju-si (KR); Mingu Lee, Cheonan-si (KR); Hyeonggyun Cheong, Suwon-si (KR); Yunpyo Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 121 days.

(21) Appl. No.: 17/988,469

(22) Filed: Nov. 16, 2022

(65) Prior Publication Data

US 2023/0163094 A1    May 25, 2023

(30) Foreign Application Priority Data

Nov. 23, 2021  (KR) .......................... 10-2021-0162166

(51) Int. Cl.
*H01L 23/00* (2006.01)
*H01L 21/683* (2006.01)

(52) U.S. Cl.
CPC .......... *H01L 24/80* (2013.01); *H01L 21/6838* (2013.01); *H01L 24/74* (2013.01);
(Continued)

(58) Field of Classification Search
CPC ..... H01L 24/80; H01L 21/6838; H01L 24/74; H01L 24/08; H01L 24/32; H01L 24/75;
(Continued)

(56) References Cited

U.S. PATENT DOCUMENTS 8,042,593 B2    10/2011  Yoon et al.
2009/0261537 A1*  10/2009  Pan ..................... H01L 21/6838
                                                          279/46.1
(Continued)

FOREIGN PATENT DOCUMENTS

JP      2004-319599 A      11/2004
KR   10-2005-0122909 A     12/2005
(Continued)

*Primary Examiner* — S. Behrooz Ghorishi

(74) *Attorney, Agent, or Firm* — Muir Patent Law, PLLC

(57) ABSTRACT

A chip bonding apparatus, includes: a body; a substrate conveyor installed on the body to transfer a substrate; a bonding head conveyor disposed on an upper surface of the body; an alignment unit installed on the body and adjusting a position of the substrate and a position of a chip; and a bonding head installed in the bonding head conveyor and moved and attaching a chip therebelow, wherein the bonding head is provided with a chip bonding unit for attaching the chip in a lower end portion thereof, wherein the chip bonding unit, includes: a chip bonding unit body having an installation groove formed therein; a pushing module having one end portion inserted in the installation groove; and an attachment module having a deformable member deformed by the pushing module; wherein the deformable member is provided with a deformable portion which is deformed by being pressed by the pushing module, and having a bottom surface in contact and exerting a force on the chip to bond the chip to the substrate.

17 Claims, 12 Drawing Sheets

(52) U.S. Cl.
CPC .............. *H01L 24/08* (2013.01); *H01L 24/32* (2013.01); *H01L 24/75* (2013.01); *H01L 24/83* (2013.01); *H01L 2224/08221* (2013.01); *H01L 2224/32221* (2013.01); *H01L 2224/75304* (2013.01); *H01L 2224/75312* (2013.01); *H01L 2224/75745* (2013.01); *H01L 2224/75824* (2013.01); *H01L 2224/7592* (2013.01); *H01L 2224/80093* (2013.01); *H01L 2224/8018* (2013.01); *H01L 2224/80201* (2013.01); *H01L 2224/80894* (2013.01); *H01L 2224/80908* (2013.01); *H01L 2224/83093* (2013.01); *H01L 2224/8318* (2013.01); *H01L 2224/83201* (2013.01); *H01L 2224/83908* (2013.01)

(58) Field of Classification Search
CPC ........... H01L 24/83; H01L 2224/08221; H01L 2224/32221; H01L 2224/75304; H01L 2224/75312; H01L 2224/75745; H01L 2224/75824; H01L 2224/7592; H01L 2224/80093; H01L 2224/8018; H01L 2224/80201; H01L 2224/80894; H01L 2224/80908; H01L 2224/83093; H01L 2224/8318; H01L 2224/83201; H01L 2224/83908; H01L 21/68; H01L 24/00; H01L 21/67144; H01L 21/52; H01L 21/67721; H01L 2224/75314; H01L 2224/7532; H01L 2224/76314; H01L 2224/7632; H01L 2224/77325; H01L 2224/77328; H01L 2224/7831; H01L 2224/78312; H01L 2224/78325; H01L 2224/78328; H01L 2224/79314; H01L 2224/7932; H05K 13/0409

See application file for complete search history.

(56) References Cited

U.S. PATENT DOCUMENTS

| 2014/0318683 | A1* | 10/2014 | Johnson ............ H01L 21/67092 |
| | | | 156/64 |
| 2015/0228612 | A1 | 8/2015 | Ha et al. |
| 2016/0190087 | A1 | 6/2016 | Yu et al. |
| 2017/0221856 | A1* | 8/2017 | Yamauchi ............... H01L 24/94 |
| 2020/0077550 | A1 | 3/2020 | Hoefs et al. |
| 2022/0102185 | A1 | 3/2022 | Lee et al. |

FOREIGN PATENT DOCUMENTS

| KR | 20-2009-0006234 U | | 6/2009 |
| KR | 10-2011-0070055 A | | 6/2011 |
| KR | 10-1335275 B1 | | 11/2013 |
| KR | 10-2015-0094116 A | | 8/2015 |
| KR | 10-2016-0082920 A | | 7/2016 |
| KR | 10-2017-0070024 A | | 6/2017 |
| KR | 10-2018-0040349 A | | 4/2018 |
| KR | 20180115584 A | * | 10/2018 |
| KR | 10-2020-0084127 A | | 7/2020 |
| KR | 10-2021-0050563 A | | 5/2021 |
| WO | 2020-048950 A2 | | 3/2020 |

* cited by examiner

APPARATUS FOR BONDING CHIP BAND AND METHOD FOR BONDING CHIP USING THE SAME

CROSS-REFERENCE TO RELATED APPLICATION

This application claims the priority and benefit of Korean Patent Application No. 10-2021-0162166, filed on Nov. 23, 2021, with the Korean Intellectual Property Office, the inventive concept of which is incorporated herein by reference.

BACKGROUND

1. Field

The present inventive concept relates to a chip bonding apparatus and a method for bonding a chip.

2. Description of Related Art

In general, in order to bond a chip to a substrate, a process of aligning and processing the chip on the substrate is necessary. In a bonding process, not using any other medium for bonding the chip to the substrate, it may be necessary to manage parallelism within 100 nm to control parallelism between the chip and the substrate to suppress generation of air bubbles. However, it becomes difficult in practice to manage the parallelism in a die bonding device operating at a high speed and frequently applying a bonding load.

Accordingly, a method of bonding the chip and the substrate after deforming a shape of the chip by applying a load to a central portion of the chip is used, but in this case, the deformed shape of the chip is not constant, there is a problem in that the chip may be damaged when the substrate and the chip are in contact. Furthermore, since the chip is deformed as a load is directly applied to the chip, there is a problem in that a risk of chip breakage increases.

Accordingly, there is a need to develop a device capable of preventing chip breakage while preventing air bubbles from being generated between the chip and the substrate.

SUMMARY

An aspect of the present inventive concept is to provide a chip bonding apparatus and a method of manufacturing for bonding a chip that is capable of preventing chip breakage.

An aspect of the present inventive concept is to provide a chip bonding apparatus and a method of manufacturing for bonding a chip capable of preventing air bubbles from being generated between a chip and a substrate.

According to an aspect of the present inventive concept, a chip bonding apparatus includes: a body; a substrate conveyor installed on the body to transfer a substrate; a bonding head conveyor disposed on an upper surface of the body; an alignment unit installed on the body configured to adjust a position of the substrate and a position of the chip; and a bonding head installed in the bonding head conveyor and moved to attach a chip therebelow, wherein the bonding head is provided with a chip bonding unit for attaching the chip therebelow, wherein the chip bonding unit includes: a chip bonding unit body having an installation groove formed therein; a pushing module having one end portion inserted in the installation groove; and an attachment module having a deformable member deformable by the pushing module; wherein the deformable member is provided with a deformable portion which is deformed by being pressed by the pushing module, and having a bottom surface that contacts the chip to exert a force on the chip to bond the chip to the substrate.

According to an aspect of the present inventive concept, a method for bonding a chip includes: determining whether a deformable portion provided in a deformable member and a chip are in contact; controlling a degree of deformation of the chip while detecting the degree of deformation of the deformable portion through a displacement sensor; determining whether the chip and the substrate are in contact; and sequentially bonding portions of the chip to the substrate while controlling driving of an actuator of a push module and a Z-axis driver of a bonding head so that a load applied to the chip remains constant during the sequential bonding.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, preferred example embodiments of the present inventive concept will be described with reference to the accompanying drawings as follows.

Figure 1:
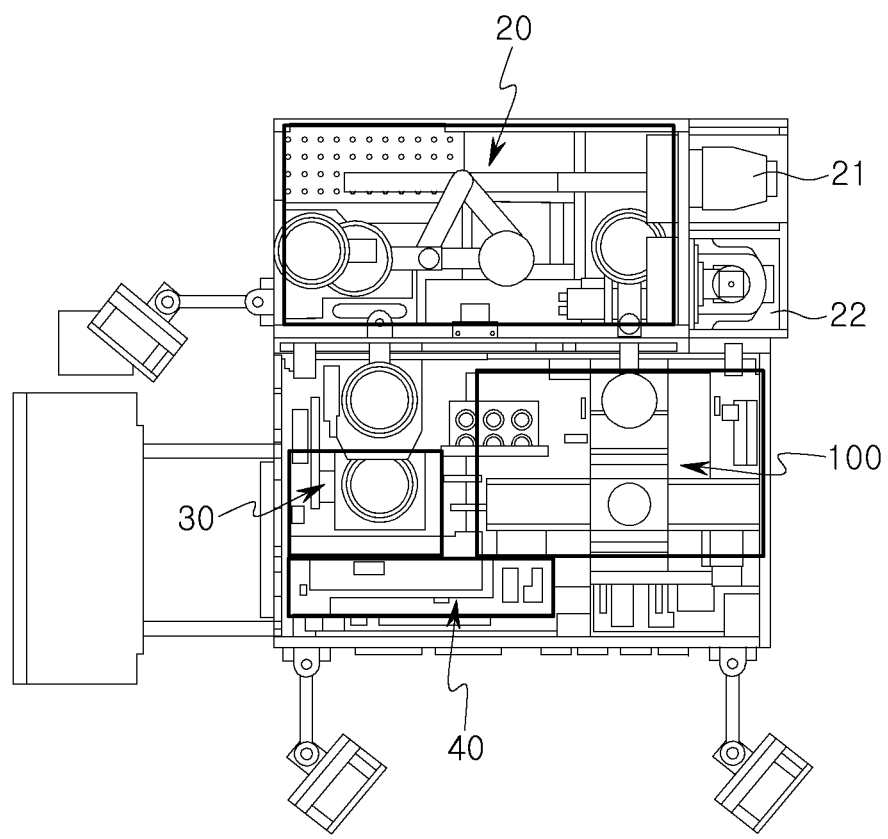
FIG. 1 is a block diagram illustrating a die bonding device including a chip bonding apparatus according to an example embodiment.

FIG. 1 is a block diagram illustrating a die bonding device 10 including a chip bonding apparatus according to an example embodiment.

Referring to FIG. 1, a die bonding device 10 may include a chip and substrate supply module 20, a chip separation module 30, a chip transfer module 40, and a chip bonding apparatus 100.

The chip and substrate supply module 20 may include an Equipment Front End Module (EFEM) or a Load Port Module (LPM), and serve to withdraw the substrate from the substrate storage unit 21 and supply the same to the chip bonding apparatus 100, and supply a chip from the chip storage unit 22 to the chip separation module 30. For example, the substrate storage unit 21 may be a 300 mm Front Opening Unified Pod (FOUP) or a Front Opening Shipping Box (FOSB). In addition, the chip storage unit 22 may be a 400 mm FOUP (Front Opening Unified Pod) or a MAC storing a chip attached to a ring frame.

The chip separation module 30 is a device expanding a film so that the chip can be easily detached from the film 31 (see, FIG. 2) of a ring frame, and includes an ejector 33 (see FIG. 2) physically pushing up the chip 102 so that it can be detached from the film. Here, referring briefly to an operation of the chip separation module 30 with reference to FIG.

2, first, the film 31 to which the chip 102 is attached is expanded in an expander 32, so that the chip 102 is in a good state to be detached from the film 31. Thereafter, after the ejector 33 is aligned and positioned under the chip 102, the film 31 and the chip 102 are pushed upwardly. In this case, the area of attachment between the chip and the film is reduced, so that the chip 102 is easily separated from the film. Thereafter, a pickup device 42 of the chip transfer module 40 (see FIG. 1) separates the chip 102 pushed up by the ejector 33 from the film 31, and then transfers the same to the chip bonding apparatus 100 (see FIG. 1). In this case, the pickup device 42 may transfer the chip 102 to the chip bonding apparatus 100 as it is in a state separated from the film 31, or may transfer the chip 102 upside down.

Figure 2:
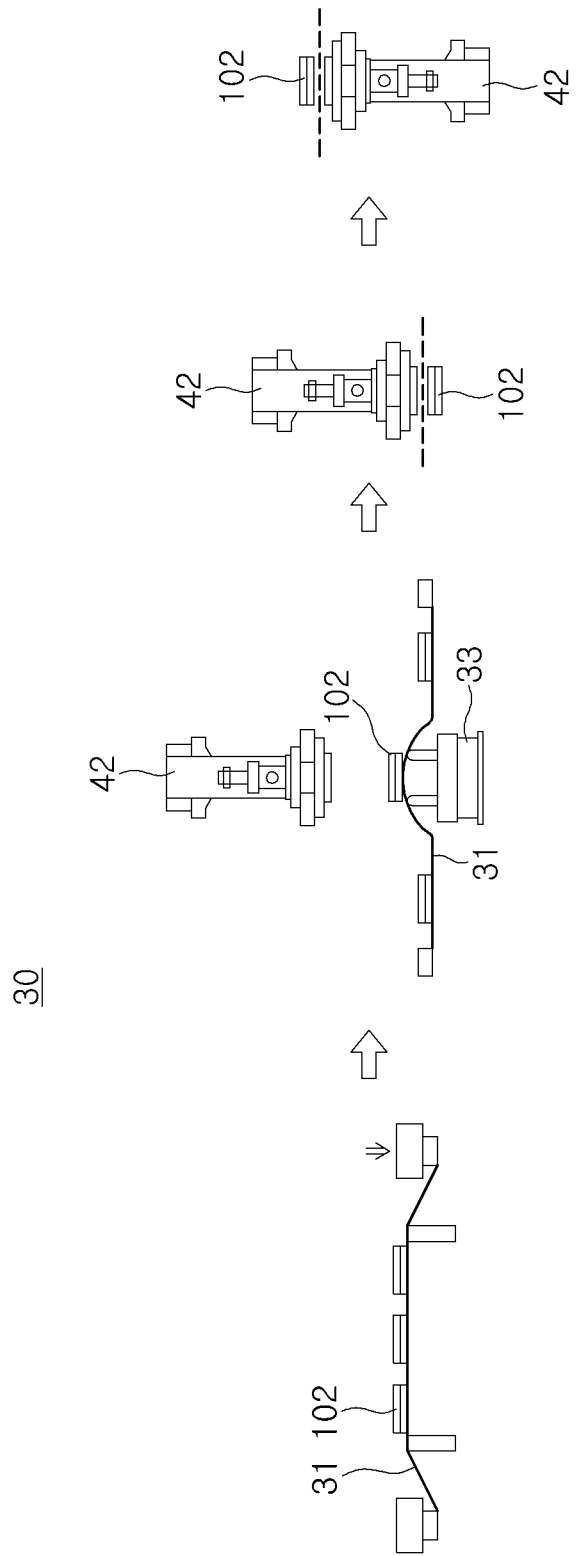
FIG. 2 is an explanatory diagram for illustrating an operation of a chip separation module provided in a die bonding device according to an exemplary embodiment.

Referring back to FIG. 1, the chip transfer module 40 serves to transfer the chip 102 (refer to FIG. 2) separated from the film 31 in the chip separation module 30 to the chip bonding apparatus 100. To this end, the chip transfer module 40 may include a pickup device 42 as illustrated in FIG. 2. The chip transfer module 40 may be disposed on one side of the chip separation module 30 and the chip bonding apparatus 100. In addition, the chip transfer module 40 may serve to discharge the film 31 (see FIG. 2) from which the chip 102 (see FIG. 2) has been removed to al location external to the die bonding device 10.

The chip bonding apparatus 100 is disposed adjacently to the chip transfer module 40 and bonds the chip 102 (refer to, FIG. 2) to a substrate 104.

Figure 3:
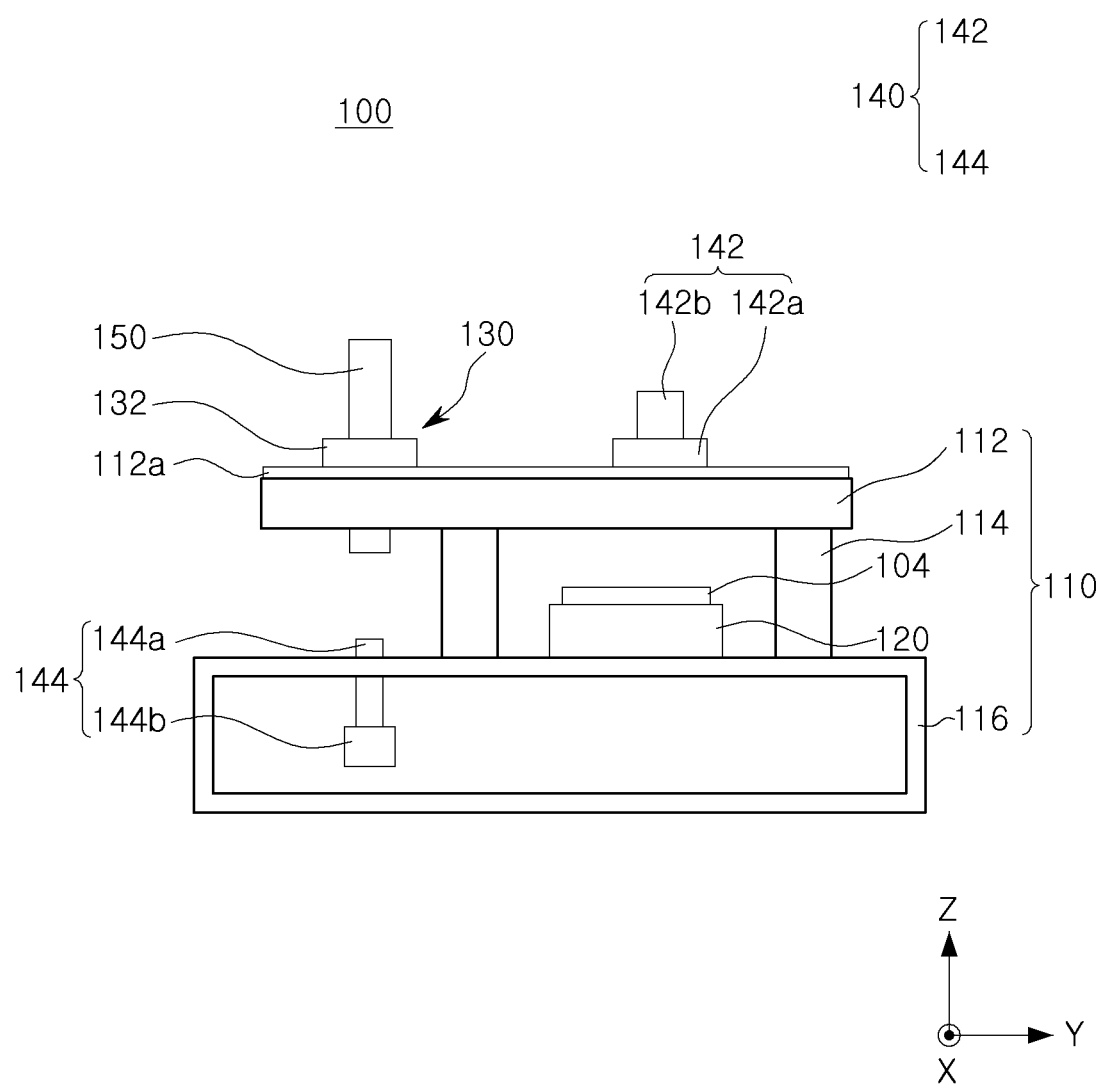
FIG. 3 is a schematic side view illustrating a chip bonding apparatus according to an example embodiment.

FIG. 3 is a schematic side view illustrating a chip bonding apparatus 100 according to an example embodiment.

Referring to FIG. 3, a chip bonding apparatus 100 according to an example embodiment, may include, for example, a body 110, a substrate conveyor 120, a bonding head conveyor 130, an alignment unit 140, and a bonding head 150.

The body 110 has, for example, a bonding head conveyor 130 disposed on an upper surface thereof. In addition, the body 110 may be a frame in which the substrate conveyor 120 is disposed in an internal space formed (or defined) by the body 110 (e.g., a space about which the frame is formed). For example, the body 110 may include an upper frame 112 in which the bonding head conveyor 130 is installed and a column frame 114 in which the substrate conveyor 120 is disposed therebetween. However, the present inventive concept is not limited thereto, and a shape of the body 110 may be variously changed. In addition, the body 110 may further include a lower frame 116 from which the pillar frame 114 extends upwardly.

The substrate conveyor 120 serves to transfer a substrate 104 supplied by the above-described chip and substrate supply module 20 (refer to FIG. 1) to a position where it will bonded to the chip (chip not shown in FIG. 3). For example, the substrate conveyor 120 may be disposed between the pillar frames 114 of the body 110. The substrate conveyor 120 moves the substrate 104 in an X-axis direction (perpendicular to the paper of FIG. 3). For example, when the bonding of the chip and the substrate 104 is completed, the substrate conveyor 120 may transfer the substrate 104 on which the chip is stacked to the chip and substrate supply module 20 (refer to FIG. 1) and the chip and the substrate supply module 20 may be discharged to a location external to the die bonding device 10 using a Load Port Module (LPM).

The bonding head conveyor 130 is installed on an upper frame 112 of the body 110 to move the bonding head 150 along the upper frame 112 in a Y-axis direction of FIG. 3. For example, the bonding head conveyor 130 may include a first moving frame 132 that moves along a rail 112a of the upper frame 112. In addition, the bonding head 150 may be installed on the first moving frame 132 of the bonding head conveyor 130 to move in association with the first moving frame 132. The bonding head conveyor 130 may include a driver (not shown) for generating driving force for the movement of the first moving frame 132.

The alignment unit 140 serves to confirm a position to align the chip and the substrate. For example, the alignment unit 140 may include a first alignment unit 142 for adjusting a position of the substrate, and a second alignment unit 144 for adjusting a position of the chip 102 (not shown). The first alignment unit 142 may be installed in a second moving frame 142a movably installed in the upper frame 112 of the body 110. A first alignment detection member 142b of the first alignment unit 140 may be installed in the second moving frame 142a to move together with the second moving frame 142a to detect a position of the substrate disposed therebelow. Meanwhile, in the present example embodiment, a case in which the second moving frame 142a is configured separately from the first moving frame 132 is described as an example, but the present inventive concept is not limited thereto, and the second moving frame 142a and the first moving frame 132 may be integrally formed and can be moved in association with each other.

The second alignment unit 144 may be installed in a lower frame 116 disposed below the body 110 so as to be disposed on a movement path of the bonding head 150. For example, the second alignment unit 144 may include a second alignment detection member 144a having a number of second alignment detection members 144a, equal to the number of the bonding heads 150 and a fixing member 144b on which the second alignment detection member 144a is installed. For example, FIG. 3 illustrates a case in which one bonding head 150 and the second alignment detection member 144a are provided as an example, but the present inventive concept is not limited thereto and the bonding head 150 and the second alignment detection member 144a may be provided in plural.

The bonding head 150 is installed on a first moving frame 132 and moves together with the first moving frame 132. For example, a plurality of bonding heads 150 may be installed in the first moving frame 132. Further details of the bonding head 150 will be described later.

Figure 4:
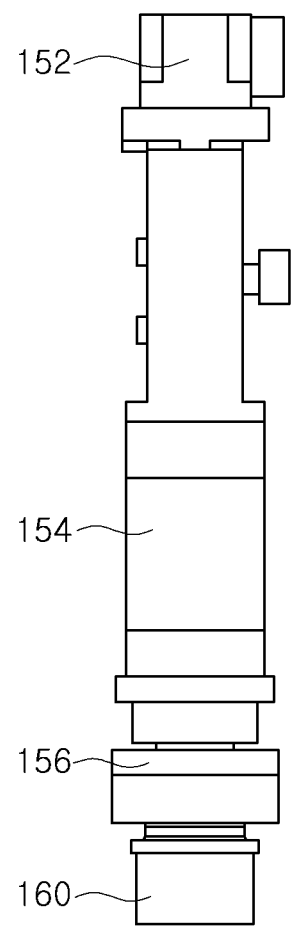
FIG. 4 is a schematic configuration diagram illustrating a bonding head of a chip bonding apparatus according to an example embodiment.

FIG. 4 is a schematic configuration diagram illustrating a bonding head of the chip bonding apparatus 100 according to an example embodiment.

Referring to FIG. 4, a bonding head 150 according to the example embodiment may include, as an example, a theta-axis driver 152, a Z-axis driver 154, a tilt adjusting driver 156, and a chip bonding unit 160.

The bonding head 150 is positioned above the substrate by the bonding head conveyor 130 (refer to FIG. 3) in a state in which a chip is held by the chip bonding unit 160. Thereafter, the bonding head 150 transfers the chip in the Z-axis direction (refer to FIG. 3) by the Z-axis driver 154 provided in the bonding head 150. As the chip approaches a bonding position with the substrate, the bonding head 150 corrects a position error by adjusting a theta axis through a theta axis driver 152. Theta refers to a rotation component in the X-Y plane. Thereafter, parallelism between the chip and the substrate is adjusted through the tilt adjusting driver 156, which may be automatically adjusted by a controller (not shown) operatively connected to the tilt adjustment driver 156, to control the same to perform this parallelism adjustment. This parallelism adjustment may act to reduce any angle between surfaces of the chip and the substrate. For example, when opposing surfaces of the chip and substrate are planar surfaces, parallelism adjustment may reduce an angle between these surfaces.

Figure 5:
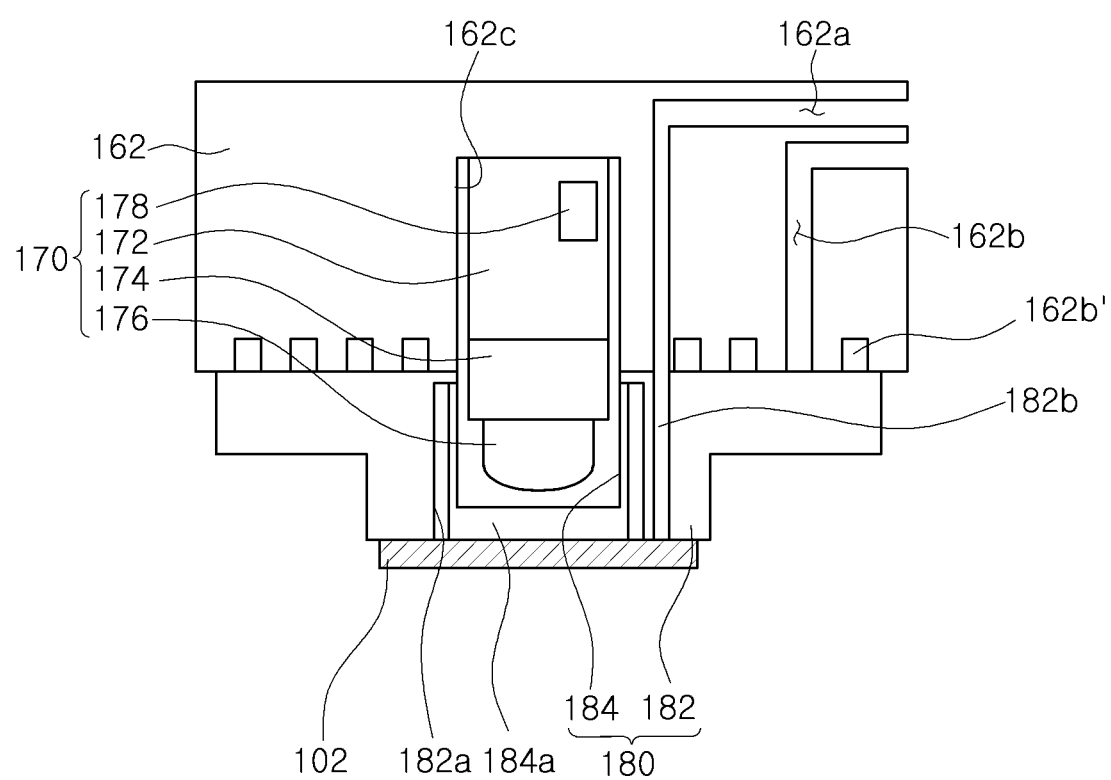
FIG. 5 is a schematic cross-sectional view illustrating the chip bonding unit of FIG. 4.

The chip bonding unit 160 is constitutes a lower end portion of the bonding head 150, and a chip 120 is held on a bottom surface thereof. FIG. 5 is a schematic cross-sectional view illustrating the chip bonding unit of FIG. 4. The chip bonding unit 160 according to an example embodiment may include, for example, a chip bonding unit body 162, a pushing module 170, and an attachment module 180.

The chip bonding unit body 162 may be provided with a chip attachment passage 162a for supplying suction force so that the chip 102 is attached to and held by the attachment module 180. In addition, a vacuum flow path 162b may be provided in the chip bonding unit body 162 to attach the attachment module 180 to the chip bonding unit body 162. Suction grooves 162b' in the lower surface of the chip bonding unit 162 may be in communication with the vacuum flow path 162b (not shown in the cross sectional view of FIG. 5) to provide suction across the upper surface of the attachment module 180. The attachment module 180 may be fixedly installed on the chip bonding unit body 162 by the suction force provided by the fixing vacuum flow path 162b. The chip bonding unit body 162 may be provided with an installation groove 162c in which the pushing module 170 is installed, and a portion of the pushing module 170 may be inserted into the installation groove 162c. In this present example embodiment, a case in which the attachment module 180 is fixedly installed to the chip bonding unit body 162 by a vacuum suction method has been described as an example, but an example embodiment thereof is not limited thereto, and the chip bonding unit body 162 and the attachment module 180 may be coupled to each other by magnetic force by a magnet. Furthermore, the chip bonding unit body 162 and the attachment module 180 may be fixed by screw fastening.

The pushing module 170, may include, for example, an actuator 172, a contact detection sensor 174 disposed below the actuator 172, and a push member 176 disposed below the contact detection sensor 174. The actuator 172 may be provided with a displacement sensor 178 for detecting displacement of the push member 176. The actuator 172 serves to raise the push member 176 so that the push member 176 presses the deformable member 184 of an attachment module 180 to be described later. The contact detection sensor 174 may detect whether the deformable member 184 and the chip 102 are in contact by detecting a load applied to the push member 176. In addition, the contact detection sensor 174 may detect a load applied to the push member 176 to detect whether the chip 102 and the substrate 104 are in contact. Furthermore, the contact detection sensor 174 may also detect whether the chip 102 and the substrate 104 are in contact with a constant load.

The displacement sensor 178 serves to detect the displacement of the push member 176 when the deformable member 184 is deformed and when the chip 102 and the substrate 104 are bonded. In other words, the controller (not shown) controls a degree of deformation of the deformable member 184 through a signal for the displacement of the push member 176 sensed by the displacement sensor 178 so that the deformable member 184 is deformed, and further, the chip 102 and the substrate 104 are bonded to each other.

For example, a lower end portion of the push member 176 may have a hemispherical shape. However, the present inventive concept is not limited thereto, and the lower end portion of the push member 176 may have a triangular cross-section or a '+' cross-section. That is, it will be possible to change a shape of the lower end portion of the push member 176 to any shape that can be sequentially contacted at the edges after first contacting the push member 176 in the central portion of the deformable member 184 to be described later.

The attachment module 180 may be provided with an attachment module body 182 having an opening 182a into which the push member 176 is inserted and a deformable member 184 installed in the attachment module body 182 and having a deformable portion 184a deformed by the push member 176. The attachment module body 182 may include an extension passage 182b in communication with (e.g., connected to) the chip attachment passage 162a of the chip bonding unit body 162, such that the extension passage 182b provides a suction force to the chip 102. Accordingly, the chip 102 may be coupled to the attachment module 180. The deformable member 184 may have a cylindrical shape with an open upper end portion (i.e., in the shape of a cylindrical cup), and the deformable portion 184a of the deformable member 184 may be formed of an elastic material which may be deformed by the push member 176. For example, the deformable member 184 may be made of aluminum or steel, such as stainless steel. The thickness of the deformable portion 184a may be larger than the thickness of the chip 102.

Hereinafter, an operation of a bonding head will be described in more detail with reference to the drawings.

FIGS. 6 to 12 are explanatory views for illustrating the operation of the bonding head.

Figure 6:
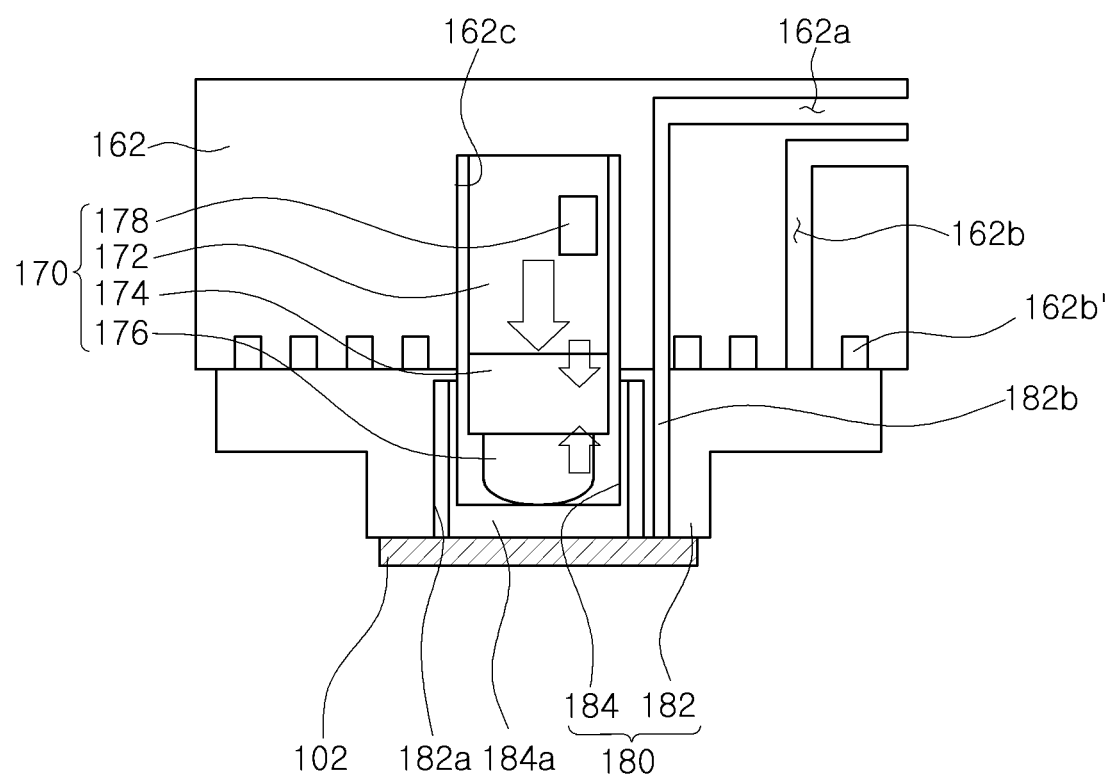
FIGS. 6 to 12 are explanatory views for illustrating an operation of the bonding head.

Thereafter, as illustrated in FIG. 6, a push member 176 is lowered by an actuator 172, so that the push member 176 is in contact with a deformable portion 184a of a deformable member 184 provided in an attachment module 180. In this case, a contact detection sensor 174 detects a contact between the deformable portion 184a of the deformable member 184 and the push member 176.

Figure 7:
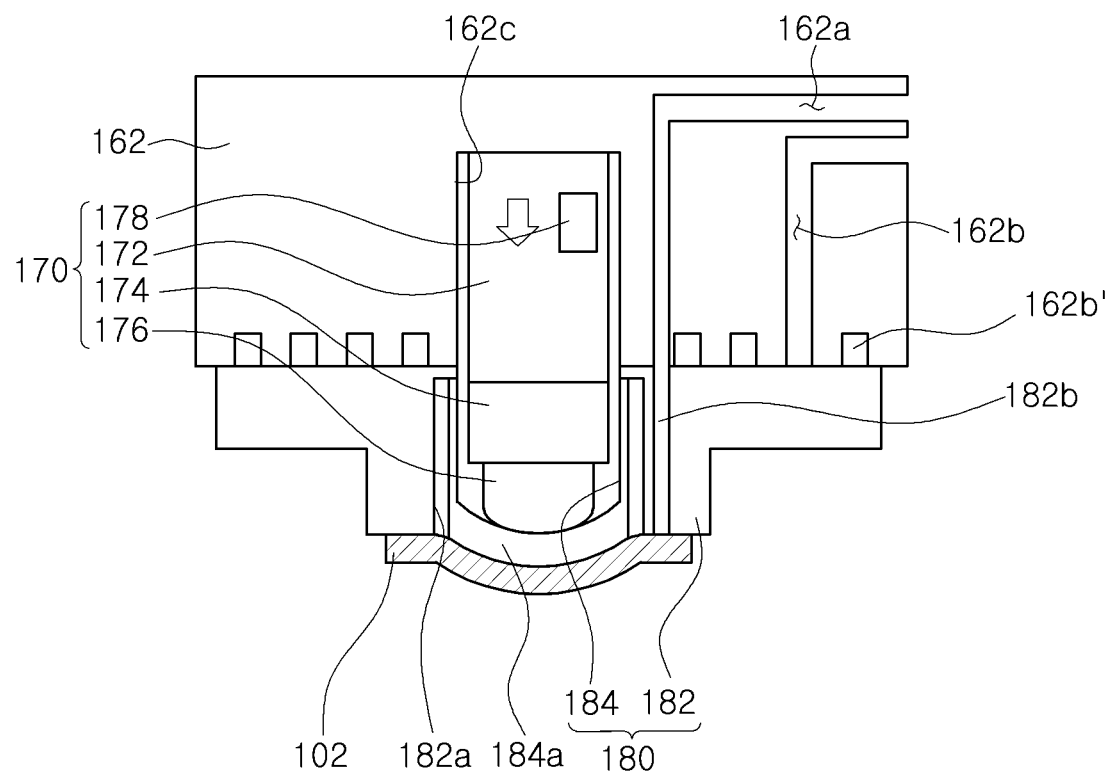

Thereafter, as illustrated in FIG. 7, the push member 176 is continuously lowered by the actuator 172, and accordingly, the deformable portion 184a of the deformable member 184 is deformed to a convex shape (protruding downwardly). Accordingly, a chip 102 attached to a bottom surface of the deformable member 184 is also deformed together with the deformable portion 184a and may also include a convex shape (protruding downwardly) in the central portion of the chip 102. For example, the bottom surface at the center of the chip 102 may be the lowest portion of the chip. In this case, the deformation of the deformable portion 184a by the actuator 172 is performed while a degree of deformation is controlled through information about displacement of the push member 176 detected by a displacement sensor 178.

Thereafter, first, a bonding head 150, having the chip 102 attached to its chip bonding unit 160 (refer to, FIG. 4) is positioned directly above an upper portion of the substrate 104 by the bonding head conveyor 130 (moving the substrate the X-axis direction) and the bonding head conveyor 130 (moving the bonding head 150 with the chip 102 attached thereto in the Y direction) (refer to, FIG. 3). With the bonding head 150 and the attached chip 102 located directly over the substrate 104, the chip bonding unit 160, provided in the bonding head 150, transfers the chip 102 in the Z-axis direction (refer to FIG. 3) by the Z-axis driver 154 (refer to, FIG. 4). As the chip 102 reaches a bonding position with the substrate, the bonding head 150 corrects for any position error by adjusting a theta axis through the theta axis driver 152 (refer to FIG. 4). Thereafter (or at the same time, or just before), the controller adjusts the parallelism between the chip 102 and the substrate 104 through the tilt adjusting driver (refer to FIG. 4).

Figure 8:
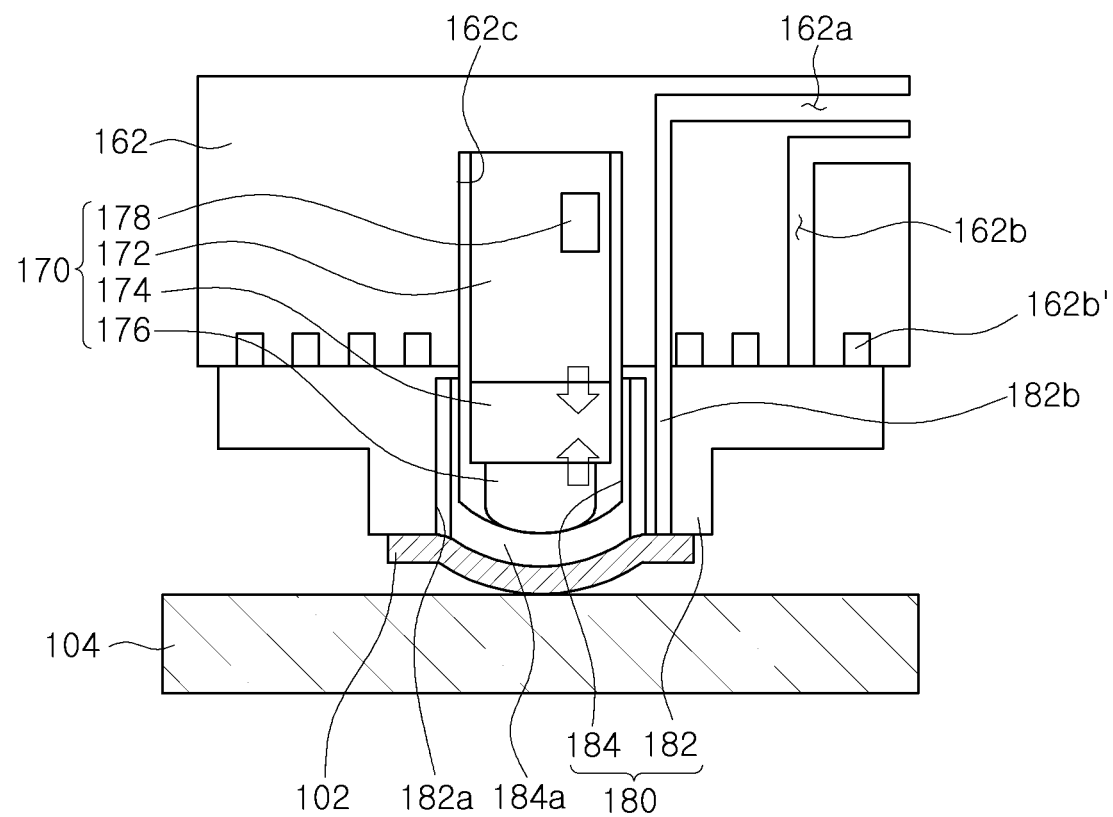

Thereafter, as illustrated in FIG. 8, the chip 102 and the substrate 104 become in contact by the Z-axis driver 154 (see FIG. 4) provided in the bonding head 150 (moving the bonding head 150 and the attached chip 102 downwardly (in the Z-axis direction)). In this case, the contact detection sensor 174 detects the contact between the chip 102 and the substrate 104.

Figure 9:
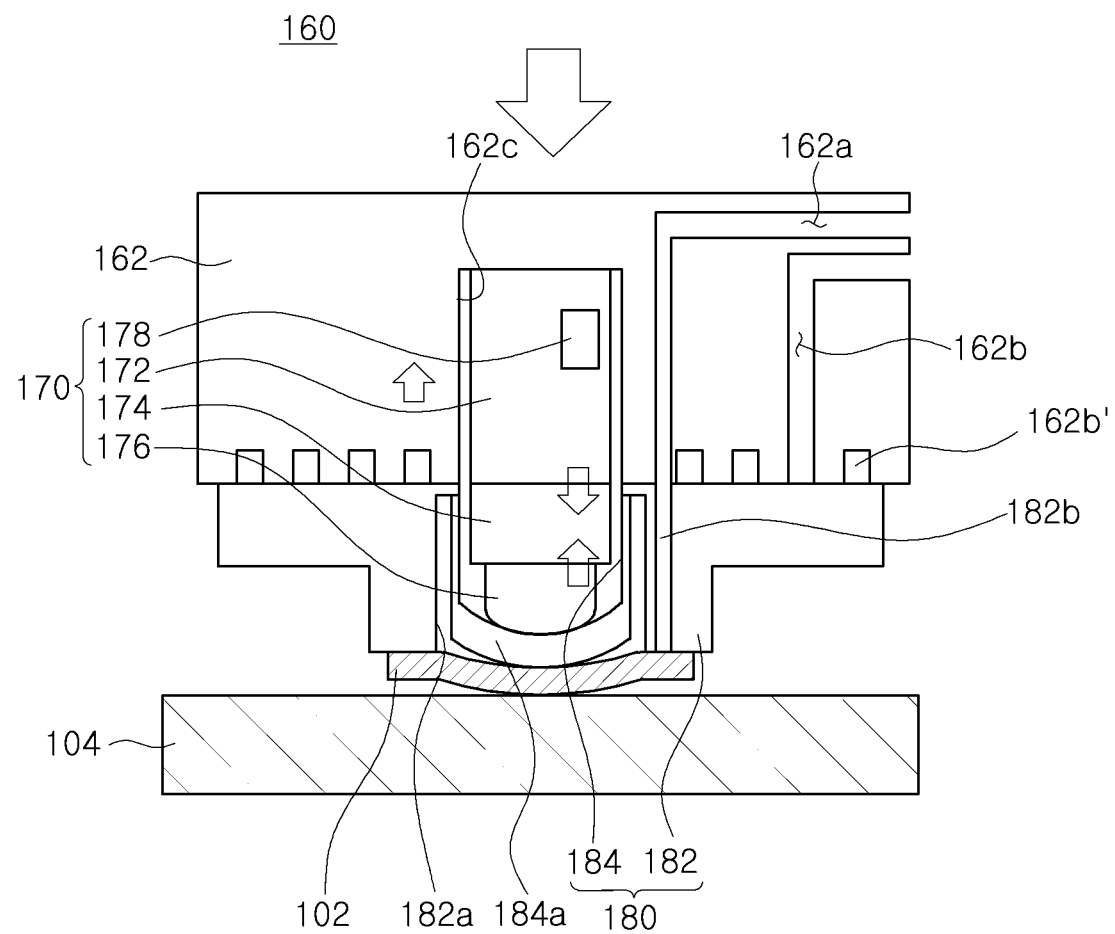

Thereafter, as illustrated in FIG. 9, the bonding head 150 continues to move downwardly in the Z-axis direction (see FIG. 3) by virtue of the Z-axis driver 154 (see FIG. 4) provided in the bonding head 150. As a result, there is an increased force exerted between the substrate 104 and the bonding head 150/chip 102, which is applied and detected by the contact detection sensor 174. When this load increases to a predetermined target level, the push member 176 is raised by the actuator 172 so that the same load is maintained between the chip 102 and the substrate 104.

Figure 10:
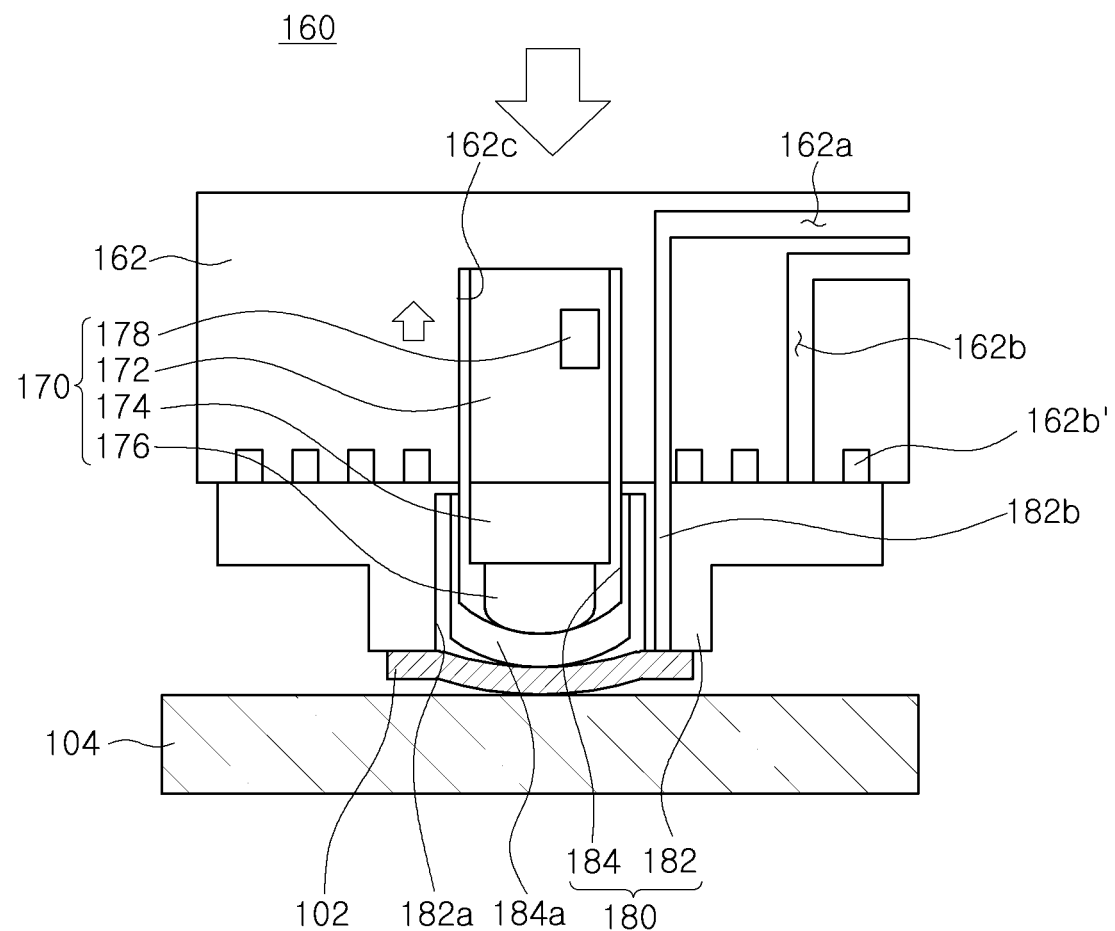

FIG. 10 illustrates raising the push member 176. Raising the push member 176 also may be performed by information regarding displacement of the push member 176 detected by the displacement sensor 178 and information about downward displacement of the push member 176 in the Z-axis direction of the bonding head 150. For example, after the load reaches a predetermined target level (as detected by the contact detection sensor 174), the push member 176 may be raised within the bonding head 150 (e.g., relative to remaining portion the bonding head 150) to positions (relative to remaining portions of the bonding head 150) that are determined by the downward displacement of the bonding head 150 (e.g., after the load reaches a predetermined target level, the increased height (relative to the remaining portions of the bonding head 150, such as with respect to the chip bonding unit body 162 and the attachment module 180) of the push member 176 is a function of the decreased height of the bonding head 150). It will be appreciated that during this operation, the push member 176 may maintain its position with respect to the substrate 104 while the bonding head 150, and the portions of the chip bonding unit 160 (other than the push member 176) continue to move downwardly, and thus the center of the chip 102 may maintain its position relative to the substrate 104, while edges and the outer sides of the chip 102 continue to move downwardly. The raising of the push member 176 and the lowering of the bonding head 150 may be performed to increase a contact area between the chip 102 and the substrate 104.

Figure 11:
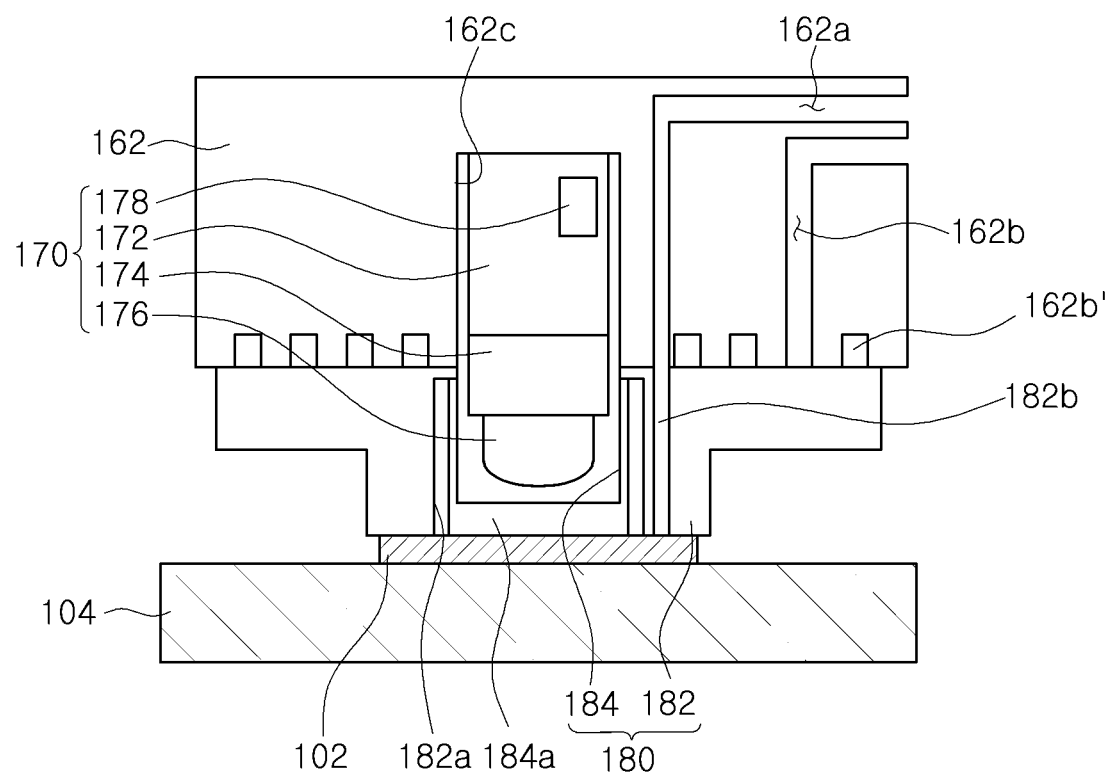

Thereafter, as illustrated in FIG. 11, the bonding head 150 continues to move downwardly by the Z-axis driver 154 (see FIG. 4) provided in the bonding head 150, and at the same time, the push member 176 is raised (e.g., relative to remaining portions of the bonding head 150) by the actuator 172 until the entire bottom surface of the chip 102) (e.g., between the opposing edges of the chip 102) is in contact with the substrate. Accordingly, the chip 102 is sequentially bonded to the substrate 104 outwardly from a central portion of the chip 102 until the edges of the chip 102 are bonded to the substrate 104. As described above, since the chip 102 and the substrate 104 are sequentially bonded to the substrate 104 from the central portion of the chip 102 until the edges of the chip 102 are bonded to the substrate 104, air bubbles may not be generated and captured between the chip 102 and the substrate 104.

Figure 12:
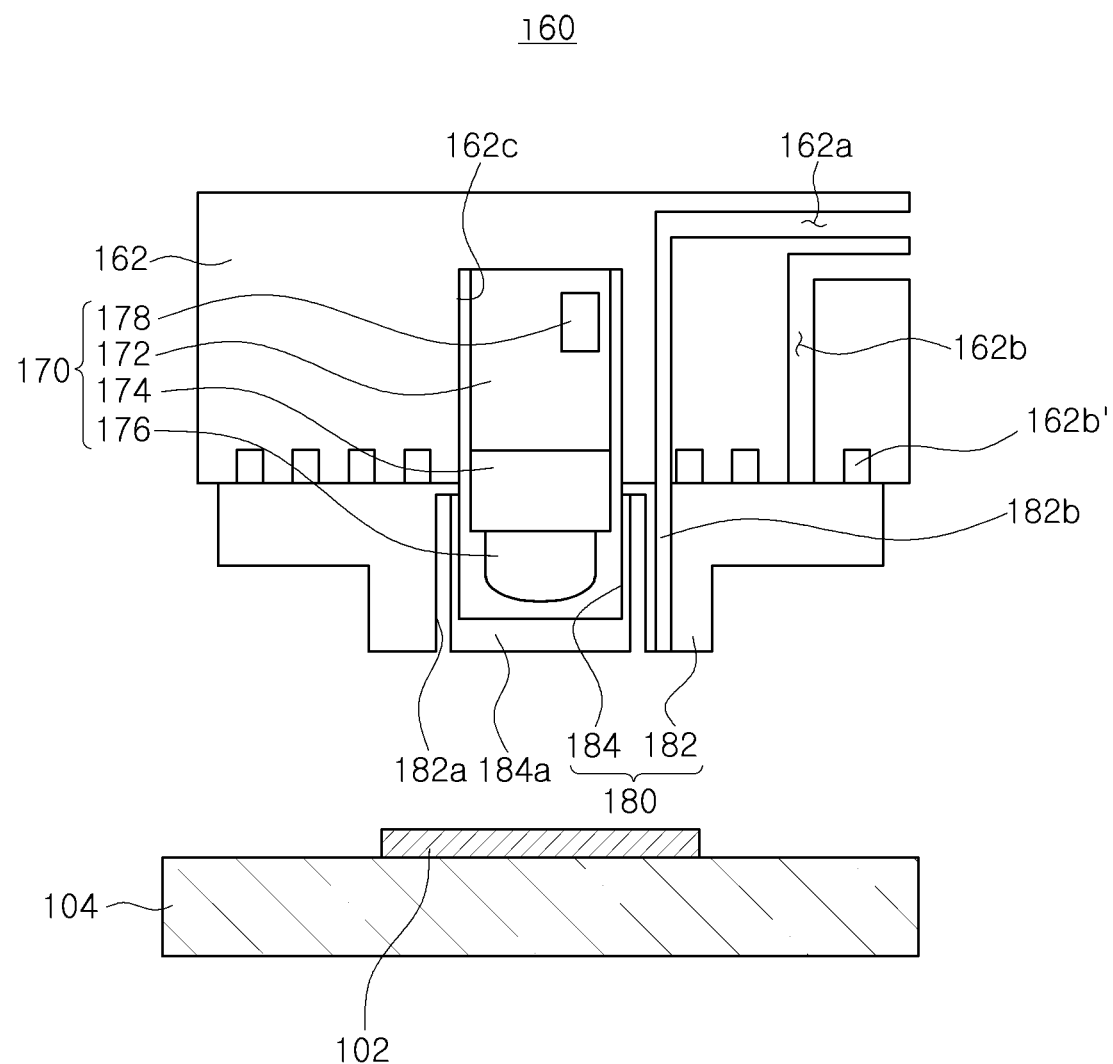

Thereafter, as illustrated in FIG. 12, a bonding process of the chip 102 and the substrate 104 is completed as the bonding head 150 is moved upwardly in the Z-axis direction by the Z-axis driver 154 provided in the bonding head 150 (see FIG. 4). As described above, by deforming the deformable portion 184a of the deformable member 184 to bond the chip 102 and the substrate 104, it is possible to prevent intensively applying an excessive load to the chip 102. Accordingly, the risk of breaking the chip 102 can be reduced.

Furthermore, by controlling the load applied to the deformable portion 184a through the information on the displacement of the push member 176 sensed by the displacement sensor 178, the chip 102 and the substrate 104 are bonded to each other, such that the risk of breaking the chip 102 may be further reduced.

Furthermore, it is possible to prevent air bubbles from being generated between the chip 102 and the substrate 104 by sequentially bringing the substrate 104 and the chip 102 into contact outwardly from a central portion of the chip 102 to the edges of the chip 102.

As set forth above, according to an example embodiment of the present inventive concept, a chip bonding apparatus capable of preventing or reducing the risk of chip breakage and a method for bonding a chip using the same may be provided.

In addition, a chip bonding apparatus capable of preventing air bubbles from being generated between a chip and a substrate, and a method for bonding a chip using the same, may be provided.

As used herein, directional descriptions (e.g., "upper," "lower," "downwardly," etc.) are used in reference to the substrate 104 to assist in describing relative positions and movement. However, these directions are set forth for convenience of explanation, and should be understood not to require a particular orientation or movement with respect to the real world operating environment of the chip bonding apparatus.

The meaning of a "connection" of a component to another component in the description includes an indirect connection through an adhesive layer as well as a direct connection between two components. It should be appreciated that the chip 102 may be bonded to the substrate 104 without an adhesive layer, but that the disclosed embodiments may also be used to attach the chip 102 to the substrate 104 with the use of an adhesive layer therebetween. Unless context indicates otherwise, it should be understood that when an element is referred to with ordinal numbers such as "first" and "second", the element is not limited thereby, and such ordinal numbers may be used only for the purpose of distinguishing one element from other similar elements. As use of ordinal numbers are typically introduced in sequence, it may be the case that the same element is referenced using different ordinal terms—e.g., a "first" element (e.g., in the specification) may be referred to elsewhere (e.g., at another portion of the specification or in the claims) as a "second" element.

The term "an example embodiment" used herein does not necessarily refer to the same example embodiment throughout the disclosure, and may be used to emphasize a particular feature or characteristic in one example embodiment that is different from that of another example embodiment. In addition, features and characteristics of example embodiments provided herein should be understood to be able to be implemented by being combined in whole or in part one with one another. For example, one element described in a particular example embodiment, even if it is not explicitly described in another example embodiment, may be understood as a description related to another example embodiment, unless context indicates otherwise.

Terms used herein are used only in order to describe an example embodiment rather than limiting the present invention. In addition, singular forms should be understood to be applicable to plural forms unless context indicates otherwise.

While example embodiments have been shown and described above, it will be apparent to those skilled in the art that modifications and variations could be made without departing from the scope of the present inventive concept as defined by the appended claims.

What is claimed is:

1. A chip bonding apparatus, comprising:
   a body;
   a substrate conveyor installed on the body to transfer a substrate;
   a bonding head conveyor disposed on an upper surface of the body;
   an alignment unit installed on the body configured to adjust a position of the substrate and a position of a chip; and
   a bonding head attached to the bonding head conveyor to move the chip attached therebelow,
   wherein the bonding head is provided with a chip bonding unit for attaching the chip, including:
      a chip bonding unit body having an installation groove formed therein;
      a pushing module having one end portion inserted into the installation groove; and
      an attachment module having a deformable member provided with a deformable portion which is deformable from pressure exerted by the pushing module, the deformable portion having a bottom surface configured to contact the chip when the chip is attached to the chip bonding unit, and
   wherein the attachment module comprises an attachment module body having an opening into which a second end portion of the pushing module is inserted, and the deformable member is fully inserted into the attachment module body and provided with the deformable portion that is deformable by the pushing module.

2. The chip bonding apparatus of claim 1, wherein the pushing module comprises:
   an actuator inserted into the installation groove;
   a contact detection sensor connected to the actuator; and
   a push member connected to the actuator,
   wherein the actuator is configured to raise and lower the push member to respectively decrease and increase deformation of the deformable member.

3. The chip bonding apparatus of claim 2, wherein the pushing module further comprises a displacement sensor to detect displacement of the push member.

4. The chip bonding apparatus of claim 2, wherein the contact detection sensor is configured to detect contact between the push member and the deformable member.

5. The chip bonding apparatus of claim 2, wherein the push member has a convex shaped bottom surface.

6. The chip bonding apparatus of claim 1, wherein the deformable member is made of an elastic material.

7. The chip bonding apparatus of claim 6, wherein the elastic material of the deformable member is aluminum or stainless steel.

8. The chip bonding apparatus of claim 1, wherein the chip bonding unit body is provided with a chip attachment flow path for supplying suction force to attach the chip to the attachment module.

9. The chip bonding apparatus of claim 8, wherein
   the attachment module comprises an attachment module body having an opening into which a second end portion of the push module is inserted, and
   the attachment module body is provided with an extension flow path in communication with the chip attachment flow path.

10. The chip bonding apparatus of claim 1, wherein the chip bonding unit body is provided with a vacuum flow path to provide a vacuum force to attach the attachment module to the chip bonding unit body.

11. The chip bonding apparatus of claim 1, wherein the bonding head comprises a theta-axis driver to rotate the chip in a horizontal plane, a Z-axis driver for raising and lowering the bonding head in a vertical direction, and a tilt adjusting driver configured to adjust parallelism between the chip and the substrate.

12. The chip bonding apparatus of claim 11, wherein the tilt adjusting driver comprises an air gyro.

13. The chip bonding apparatus of claim 1, wherein a thickness of the deformable portion is thicker than a thickness of the chip.

14. The chip bonding apparatus of claim 1, wherein the chip bonding unit body and the attachment module are coupled to each other by a magnet.

15. A chip bonding apparatus, comprising:
   a body;
   a substrate conveyor installed on the body to transfer a substrate;
   a bonding head conveyor disposed on an upper surface of the body;
   an alignment unit installed on the body configured to adjust a position of the substrate and a position of a chip; and
   a bonding head attached to the bonding head conveyor to move the chip attached therebelow,
   wherein the bonding head is provided with a chip bonding unit for attaching the chip, the chip bonding unit including:
      a chip bonding unit body having an installation groove formed therein;
      a pushing module having one end portion inserted into the installation groove; and
      an attachment module having a deformable member provided with a deformable portion which is deformable from pressure exerted by the pushing module, the deformable portion having a bottom surface configured to contact the chip when the chip is attached to the chip bonding unit,
   wherein the pushing module comprises:
      an actuator inserted into the installation groove;
      a push member connected to the actuator; and
      a displacement sensor to detect displacement of the push member,
   wherein the actuator is configured to raise and lower the push member to respectively decrease and increase deformation of the deformable member, and
   wherein the chip bonding apparatus further comprises a controller configured to control a degree of deformation of the deformable member in response to displacement detected by the displacement sensor.

16. The chip bonding apparatus of claim 15, wherein the pushing module comprises a contact detection sensor connected to the actuator, the contact detection sensor being configured to detect contact between the push member and the deformable member.

17. The chip bonding apparatus of claim 16, wherein the contact detection sensor is configured to detect a load applied to the push member to detect whether the chip and the substrate are in contact.

\* \* \* \* \*